United States Patent [19]
Kawashima

[11] 3,990,027
[45] Nov. 2, 1976

[54] CHANNEL SELECTOR FOR ELECTRONIC TUNER HAVING CHANNEL VOLTAGES STORED IN MEMORY

[75] Inventor: Kazumi Kawashima, Kyoto, Japan

[73] Assignee: Matsushita Electric Industrial Co., Ltd., Japan

[22] Filed: May 5, 1975

[21] Appl. No.: 574,731

[30] Foreign Application Priority Data
May 20, 1974  Japan.............................. 49-57106

[52] U.S. Cl.................................. 334/15; 325/464; 340/168 R
[51] Int. Cl.² ........................................ H03J 5/02
[58] Field of Search ............. 334/15; 307/264, 308; 340/168 R, 365 S; 325/459, 464, 465, 468, 470

[56] References Cited
UNITED STATES PATENTS

| | | | |
|---|---|---|---|
| 3,748,645 | 7/1973 | Kawashima | 340/168 R |
| 3,778,736 | 12/1973 | Sakamoto | 325/465 X |
| 3,845,394 | 10/1974 | Hamada | 325/464 X |
| 3,882,400 | 5/1975 | Hamada | 325/465 X |
| 3,906,351 | 9/1975 | Evans | 325/459 |

Primary Examiner—Paul L. Gensler
Attorney, Agent, or Firm—Burgess, Ryan and Wayne

[57] ABSTRACT

In a channel selector of the type having an electronic tuner in which the channel selection voltage, which is different for each channel, is applied across a voltage-variable reactance element such as a varactor diode in order to select and receive the desired channel, each channel selection voltage is converted into the digital signal, and is stored in a memory block, and in selecting the desired channel, the corresponding digital signal is read out of the memory block and is converted into the analog channel-selection signal to be applied to the tuner. A completely electronic channel selection becomes possible because any mechanical parts such as variable resistors for storing the channel selection voltages may be eliminated.

5 Claims, 12 Drawing Figures

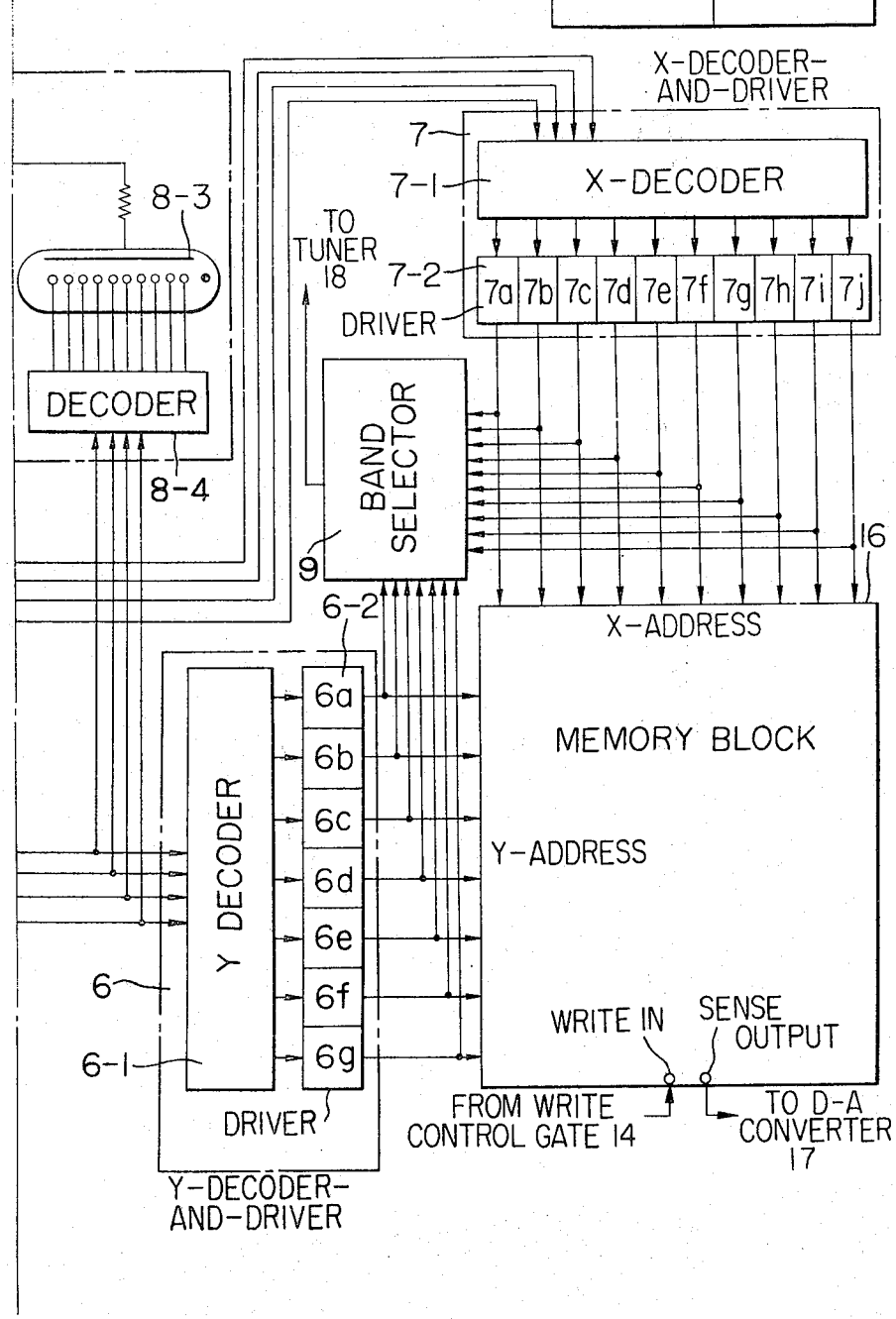

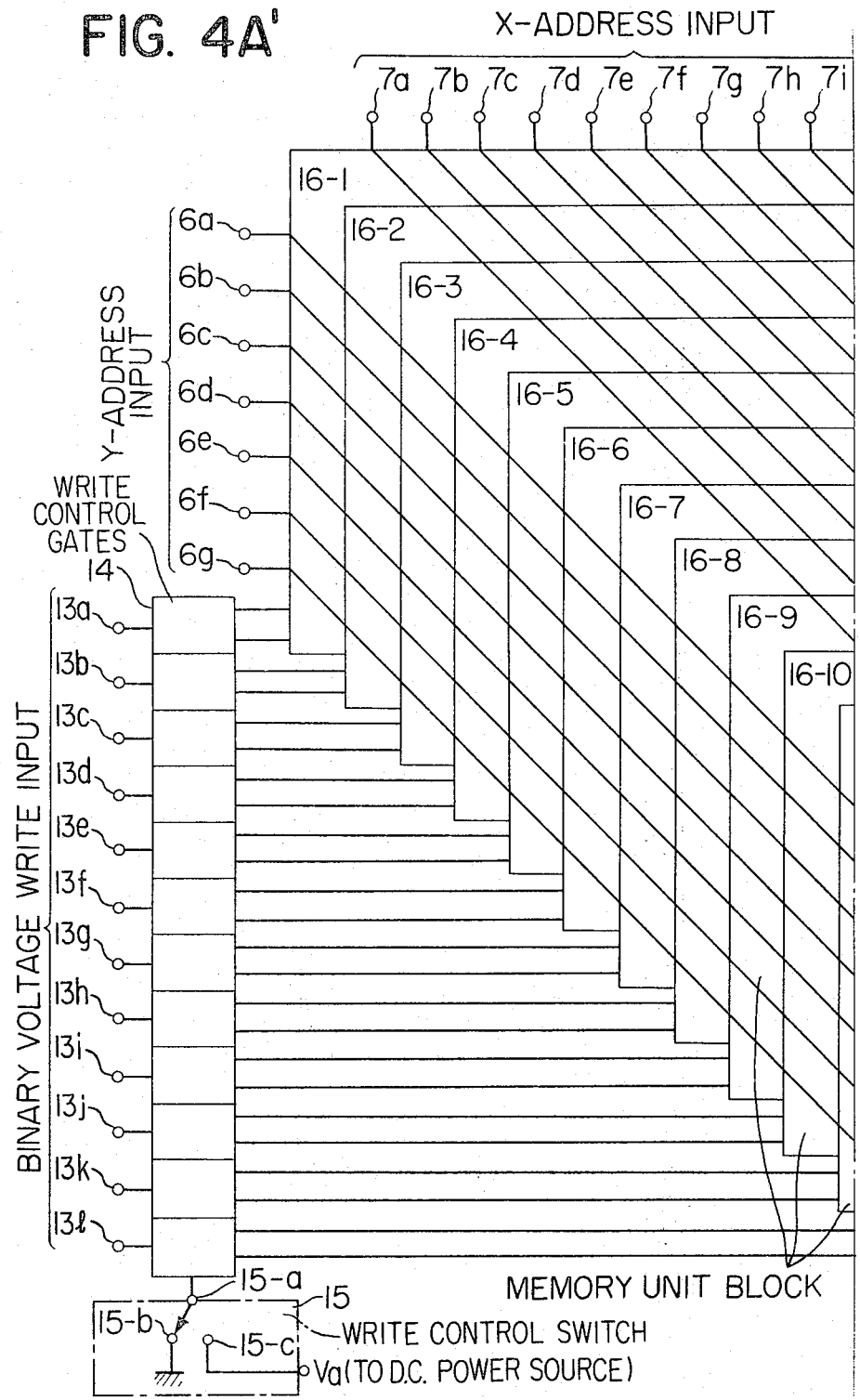

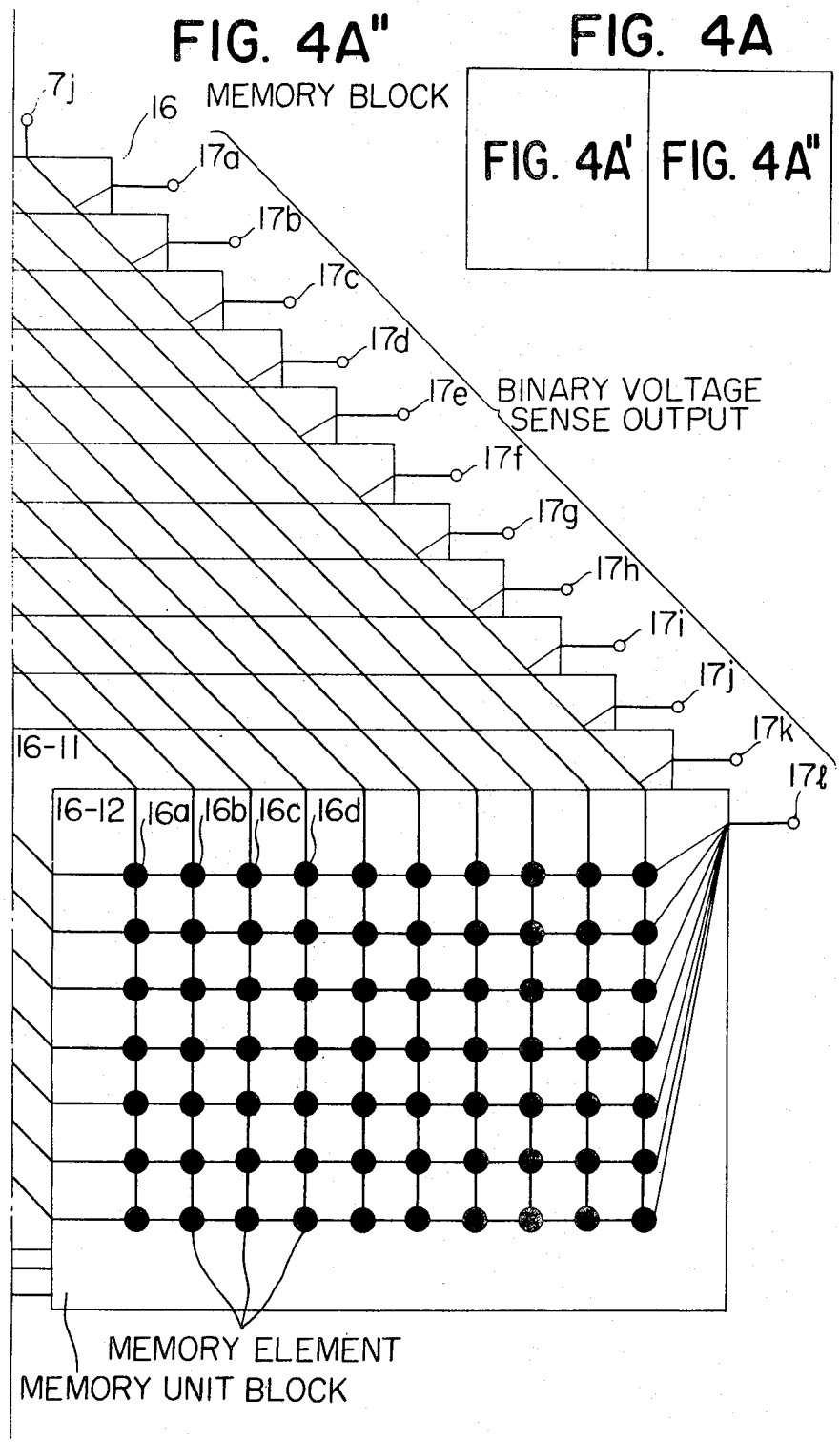

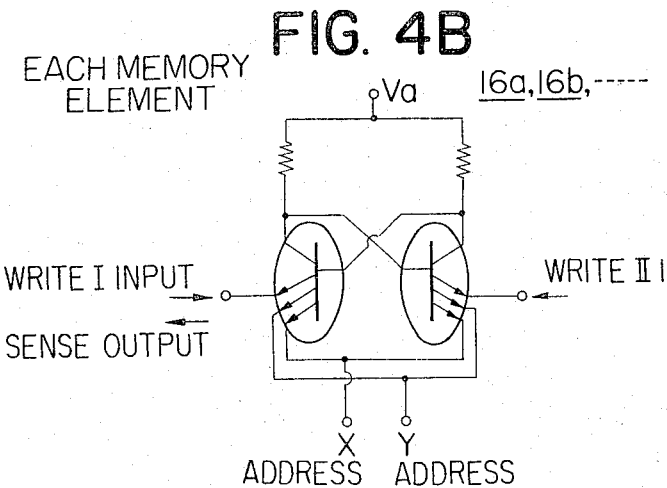
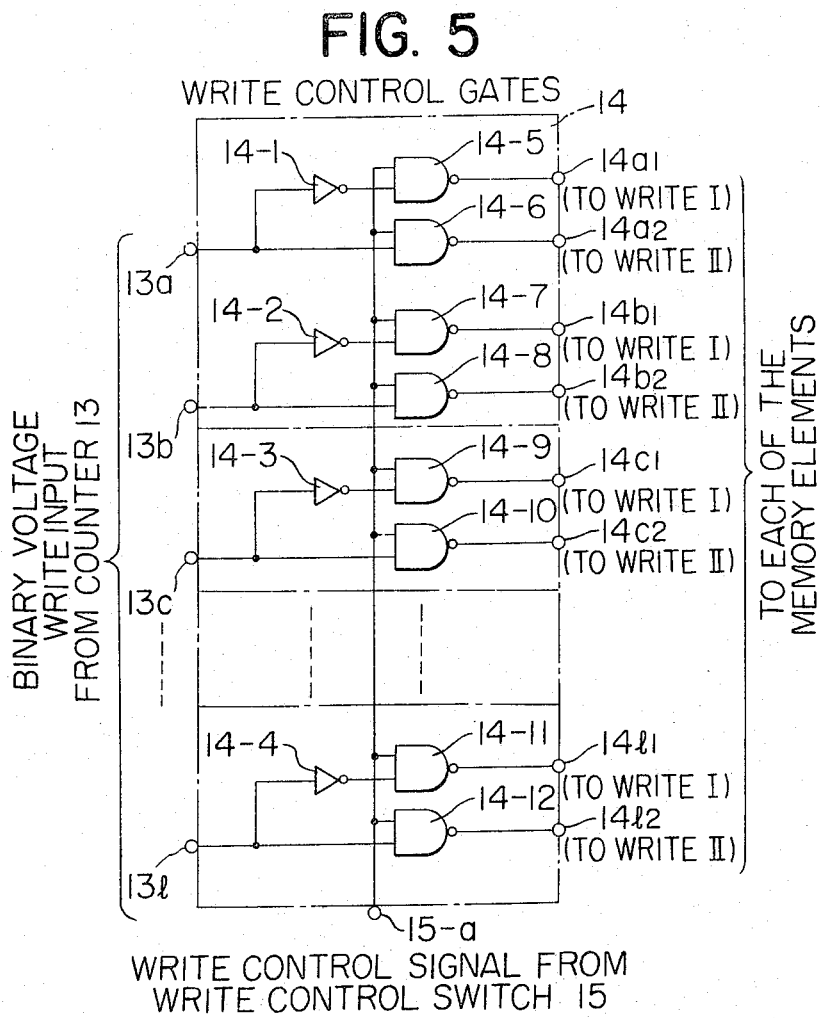

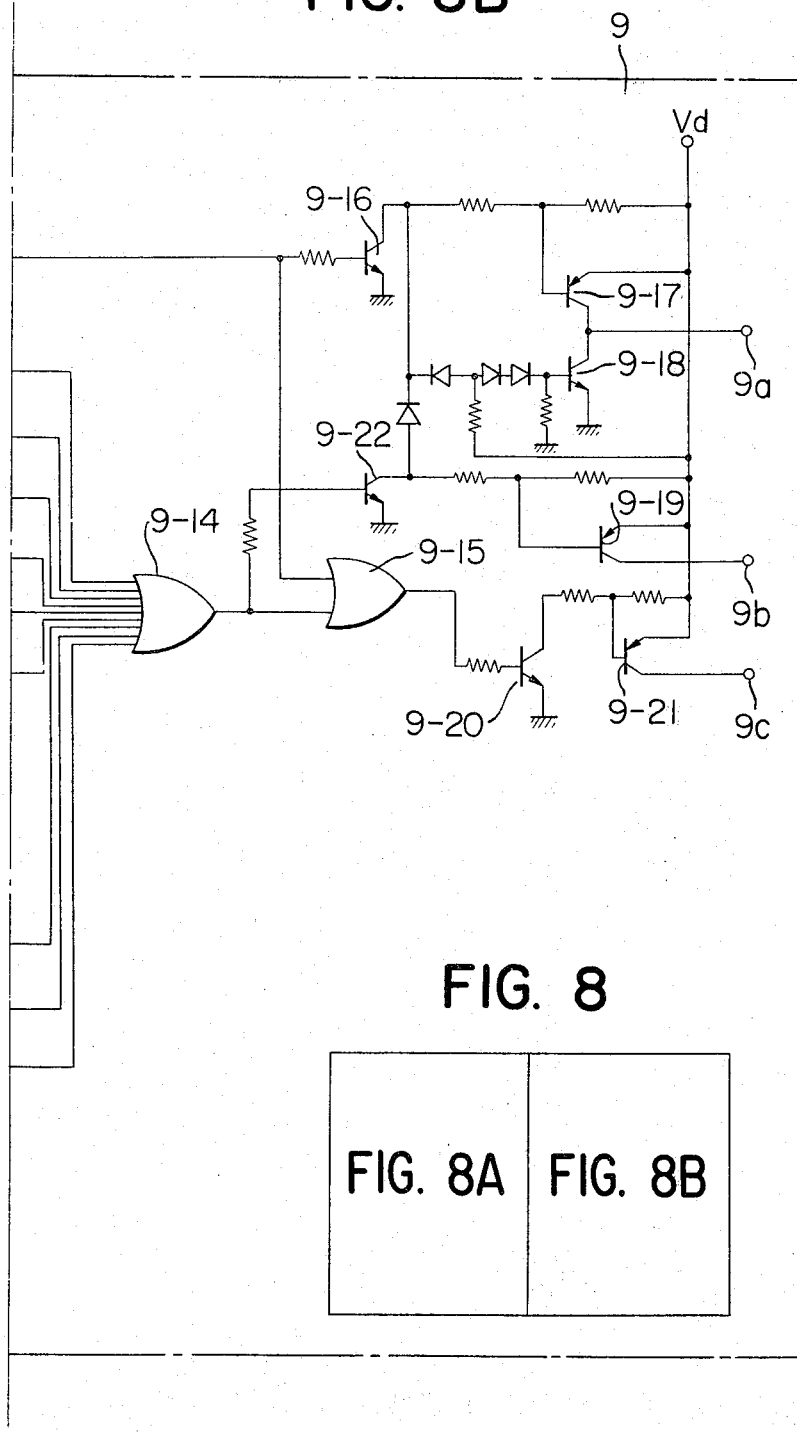

CHANNEL SELECTOR FOR ELECTRONIC TUNER HAVING CHANNEL VOLTAGES STORED IN MEMORY

BACKGROUND OF THE INVENTION

The present invention relates to generally a channel selector for a television receiver and more particularly a channel selector having an electronic tuner of the type in which the voltage applied across a voltage-variable reactance element is switched electronically in order to select the desired channel.

In the conventional channel selectors for television receivers, the tuning capacitors and coils are switched by a rotary switch in order to select the desired channel so that the conventional channel selectors are complex in construction, large in size and expensive to manufacture. Moreover, reliable and dependable channel selection cannot be attained when the contacts are worn out. In order to overcome these undesirable features, there has been devised and demonstrated the so-called electronic channel selector of the type in which a keyboard and a decimal-to-binary converter are used to select one of a plurality of variable resistors so that the voltage applied across a voltage-variable reactance element used as a tuning element may be changed depending upon the desired channel.

However, the variable resistors used in conventional electronic channel selectors are adversely affected by environmental conditions. In ambient condition of high temperatures and humidity variations in resistance and faulty switch contacts tend to occur so that the correct channel selection cannot be attained.

SUMMARY OF THE INVENTION

In view of the above, one of the objects of the present invention is to provide a channel selector in which the channel-selection voltage to be applied across a voltage-variable reactance element in an electronic tuner is converted into a digital signal and is stored in a memory block. In case of the channel selection a digital signal corresponding to the desired channel is read out from the memory block and converted to the analog channel-selection voltage signal to be applied to the voltage-variable reactance element so that a reliable and dependable channel selection may be carried out without being adversely affected by the environmental conditions such as temperature and humidity and by the aging.

Briefly stated, the present invention provides a channel selector of the type having a tuner in which the voltage applied across a voltage-variable reactance element such as a varactor diode is changed depending upon the desired channel, characterized by the provision of means for converting the channel-selection voltage, which is different for each channel and is to be applied across the voltage-variable reactance element, into a digital signal; a memory block for semi-permanently storing therein the digital signals; write means for writing or storing the digital signals at predetermined locations or addresses in the memory block; read means for reading the digital signal representative of the desired channel number entered by a keyboard out of the memory block; digital-to-analog converting means for converting the read-out digital signal into analog channel-selection voltage signal; and control means for comparing the output analog signal from the digital-to-analog converting means with a previously set channel-selection voltage signal so that a channel-selection voltage signal capable of accurately tuning in the desired channel may be obtained, and may be converted into the digital signal to be stored in the memory block.

In operation, when one enters the desired channel number by depressing the key or keys on the keyboard, the digital signal representing the desired channel is read out of the memory block and converted into an analog channel-selection voltage signal to be applied across the voltage-variable reactance element in the tuner, so that the desired channel may be selected.

The channel selector in accordance with the present invention excludes any mechanical parts, and permits an instantaneous channel selection. Moreover, the channel-selection voltages may be converted into digital signals in a manner best suited for the frequency-voltage characteristic curve of the tuner, so that the channel-selection voltages may be stored with a higher degree of accuracy and in a highly reliable manner.

When nonvolatile storage elements are used, that is storage elements wherein the stored content remains after outside electrical power is removed from the elements, the permanent storage of the channel selection voltages is possible. Furthermore, since the channel selector in accordance with the present invention consists of digital circuits, channel selectors in the form of integrated circuits (IC) or large scale integrated circuits (LSI) may be produced and the digital display of the selected channel may become possible.

BRIEF DESCRIPTION OF THE DRAWINGS

FIGS. 2A–2B is a detailed circuit diagram thereof;

FIGS. 4A'–4A'' is a schematic diagram of a memory block and a write control gate thereof;

FIG. 4B is a circuit diagram of a memory element of the memory block shown in FIG. 4A;

FIG. 5 is a detailed block diagram of the write control gate;

FIGS. 8A–8B is a detailed circuit diagram of a band selector.

DESCRIPTION OF THE PREFERRED EMBODIMENT

Figure 1:
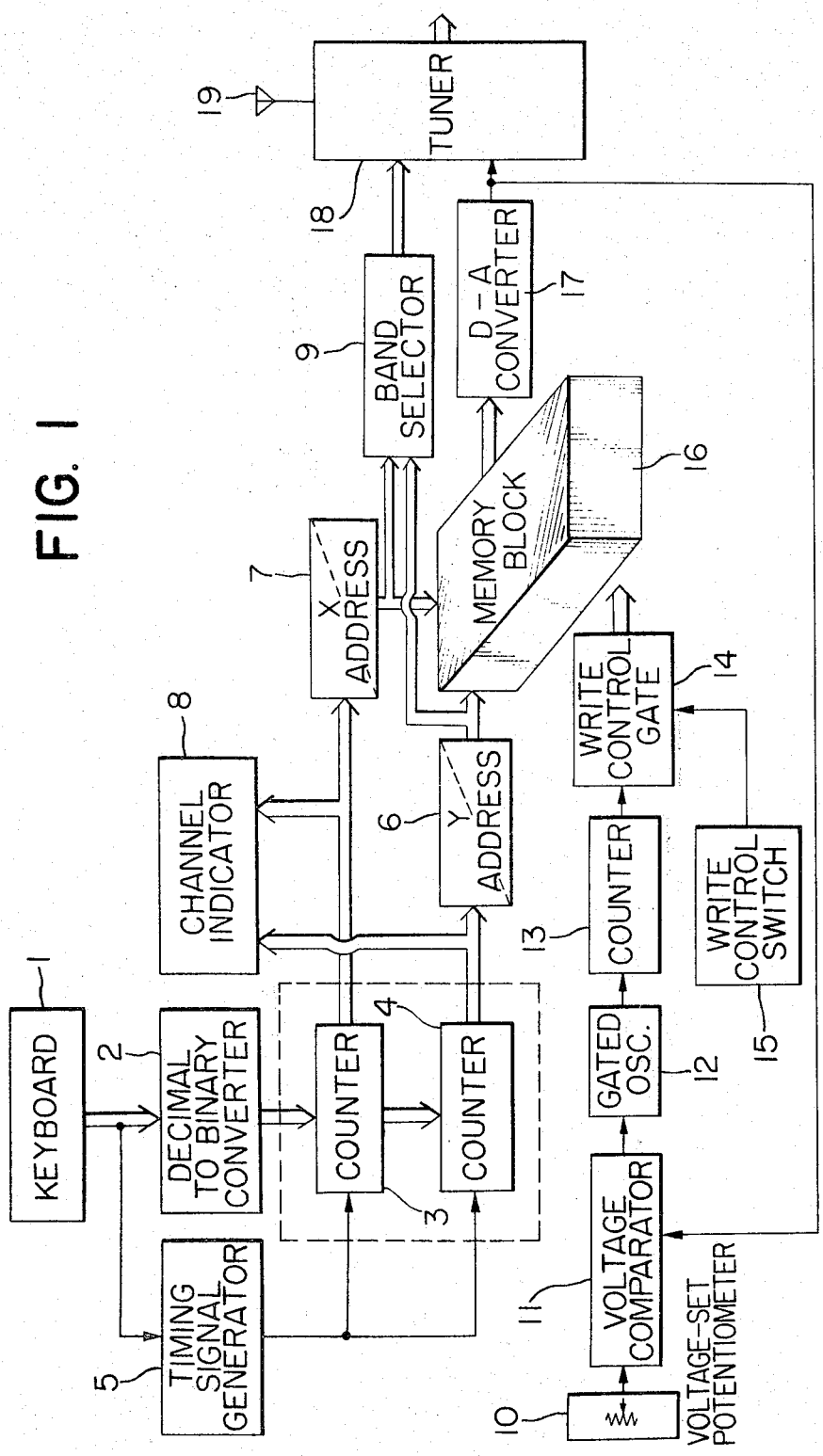
FIG. 1 is a block diagram of one preferred embodiment of the present invention.

FIG. 1 is a block diagram of a preferred embodiment of the present invention. A channel-selection keyboard 1 has 10 normally open switches, and the decimal signal representing a desired channel number entered by the keyboard 1 is converted by a decimal-to-binary converter 2 into a binary signal. In response to the signal generated when any of the switches on the keyboard 1 is depressed, a timing signal generator 5 generates a signal to be applied to presetable counters 3 and 4 for the purpose to be described in detail hereinafter.

In response to the clear signal generated when a first key on the keyboard 1 is depressed, the output from the high-order or tens digit counter 4 drops to a low level, and the binary signal representative of the number entered by the first depressed key is transferred into the low-order or unit digit counter 3. The low-order and high-order digit counters 3 and 4 remain in this state when no further input signals are applied thereto within a predetermined time after the first key is depressed. However, when a second key is depressed on the keyboard 1 in order to enter the low-order digit of the desired channel number, the content in the low-order digit counter 3 is transferred into the high-order digit counter 4 and a binary signal representative of the number entered by the second key is transferred into the low-order digit counter 3.

The outputs from the counters 3 and 4 are applied to X- and Y-decoder-drivers 7 and 6, respectively, in order to specify the X- and Y-addresses in a memory block 16. The outputs from the X- and Y-decoder-drivers 7 and 6 are also applied to a band selection signal generator 9, the output of which is applied to an electronic tuner 18 having a reactance element as a tuning element.

Next the step of writing the channel-selection voltage representative of the desired channel number into the memory block 16 will be described.

According to the instant embodiment of the present invention, each of the channel-selection voltages to be stored is converted into a digital signal consisting of 12 bits so that an accurate channel-selection voltage signal capable of tuning the tuner to the desired channel with a higher degree of accuracy may be obtained by the digital-to-analog conversion of the digital signal read from the X- and Y-addresses specified previously in the memory block 16.

The channel-selection voltage is set by a potentiometer 10 and is applied to a voltage comparator 11 to be compared with the output voltage from a digital-to-analog converter (D-A converter) 17 which converts the digital output signal consisting of 12 bits from the memory block 16 into an analog voltage signal. When the two voltage signals do not coincide with each other, a grated oscillator 12 is energized and the output of the oscillator 12 is applied to a counter 13.

When a write control switch 15 is switched to the write mode, the output signal consisting of 12 bits from the counter 13 is transferred into the memory block 16. The digital output signal from the memory block 16 is applied to the D-A converter 17, the output of which is applied to the voltage comparator 11 to be compared with the channel-selection voltage. The above operation is cycled until the output voltage signal from the D-A converter 17 coincides with the channel-selection voltage signal, and then the gated oscillator 12 is deenergized.

The channel-selection voltage signal may be changed by the potentiometer 10, and an operator may visually confirm the channel selection of the desired channel as the output from the D-A converter 17 is also applied to the tuner 18. After the desired channel has been selected, the control switch 15 is switched to the channel-selection mode so that the channel-selection voltage may be stored semi-permanently in the form of a digital signal in the memory block 16. In like manner, the channel-selection voltage signals representative of other desired channel numbers may be stored so that any desired channel may be selected automatically.

In summary, the memory block 16 is provided in order to store therein the digital channel-selection voltage signals in cooperation with the potentiometer 10, the voltage comparator 11, the gated oscillator 12, the counter 13, a write control gate 14 and the write-control switch 15, but these components are not used in channel selection. Therefore, the desired digital channel-selection voltage signals may be stored in the memory block 16 during the manufacturing process.

Figure 2A:
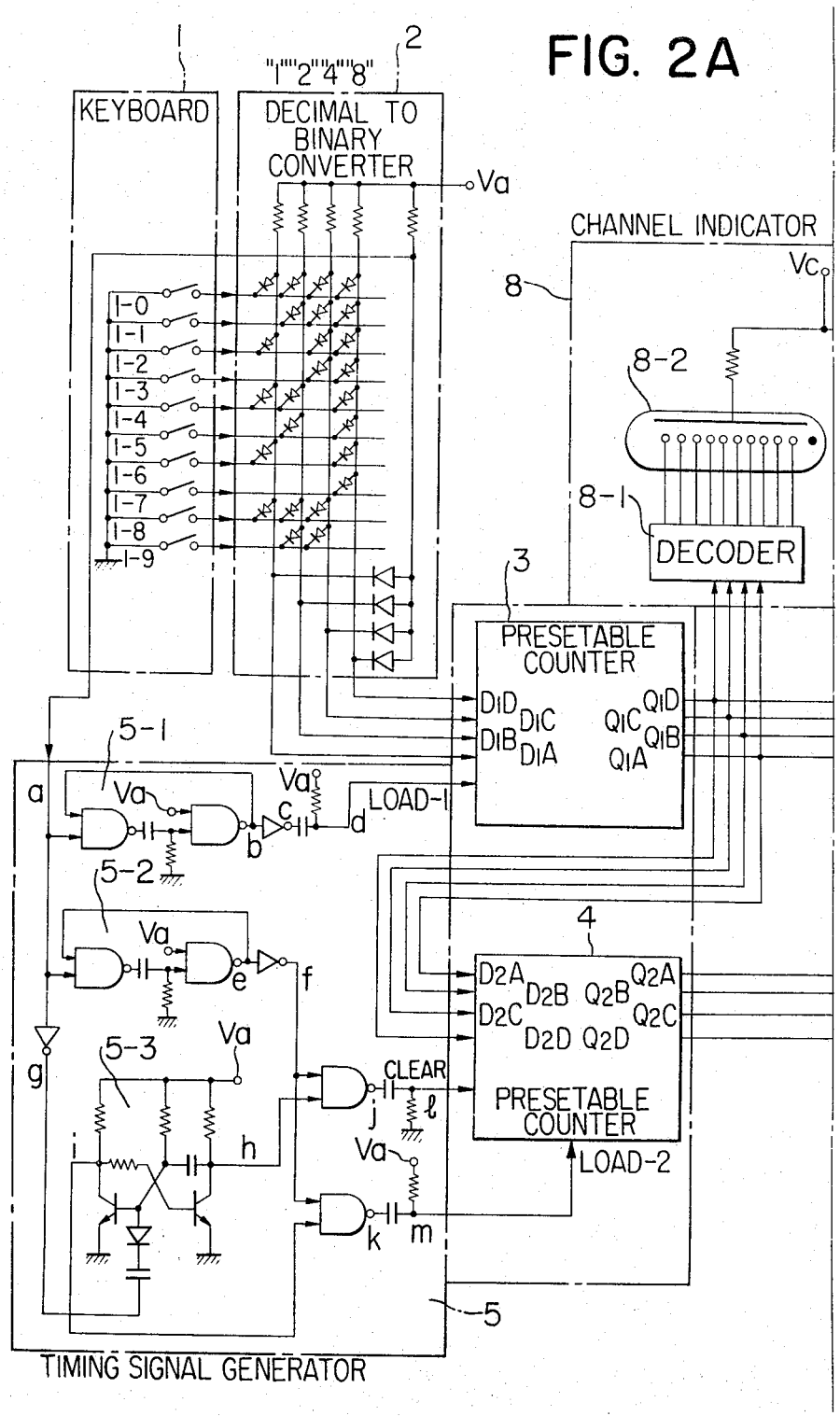

Next referring to FIG. 2, the construction of the channel selector in accordance with the present invention will be described in more detail hereinafter. The channel-selection keyboard 1 has 10 normally open switches 1-0 through 1-9, and the decimal signal from the keyboard 1 is converted into binary signal by the decimal-to-binary converter 2. The outputs from the converter 2 are applied to input terminals D1A, D1B, D1C, and D1D of the low-order counter 3. The counters 3 and 4 are so arranged that when a low-level signal is applied to their LOAD terminals, they store therein the binary signals applied thereto, but when a high-level signal is applied to the LOAD terminals, they maintain the binary signals previously transferred therein. When the high-level signal is applied to their CLEAR terminals, the contents in the counters 3 and 4 are cleared so that their output signals drop to low levels.

Figure 3:
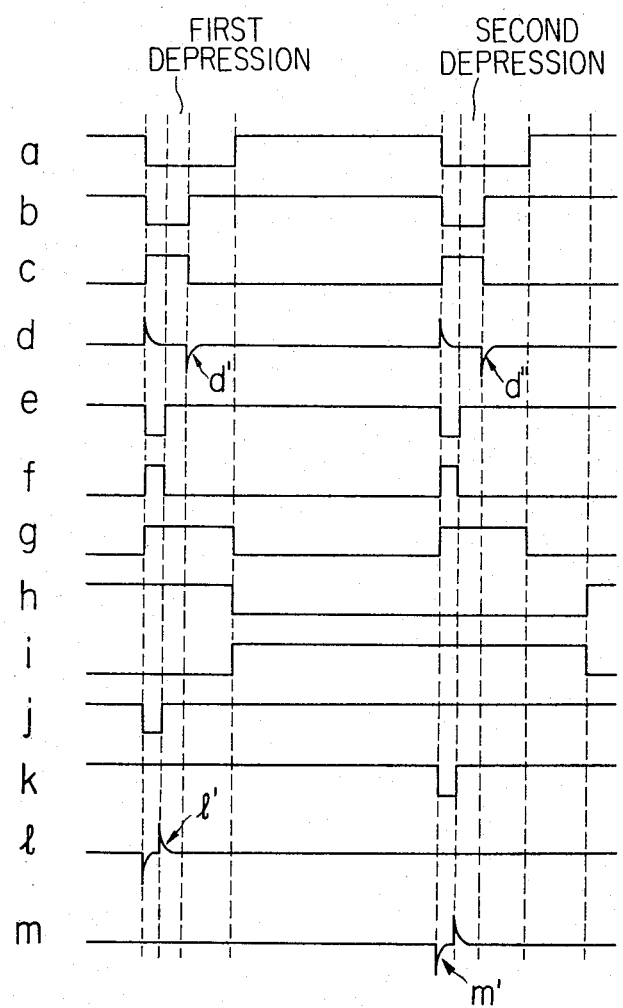
FIG. 3 shows various signal waveforms used for the explanation thereof.

The operation of the counters 3 and 4 is controlled by the timing signal generator 5 which generates the various control signals as shown in FIG. 3. When any of the switches 1-0 through 1-9 of the keyboard 1 is closed, the low-level signal as shown at $a$ in FIG. 3 is generated and applied to monostable multivibrators 5-1 and 5-2. The low-level signal $a$ is inverted to form a high-level signal as shown at $g$ in FIG. 3 and is applied to a monostable multivibrator 5-3.

The pulse width of the output signal $b$ of the monostable multivibrator 5-1 is shorter than that of the low-level signal $a$, and the pulse width of the output signal $e$ from the monostable multivibrator 5-2 is shorter than that of the output signal $b$. The pulse width of the output signals $h$ and $i$ from the monostable multivibrator 5-3 is selected slightly longer (for instance a few seconds) than a time interval between the time when a first key is depressed and the time when a second key is depressed. The output signal $b$ from the monostable multivibrator 5-1 is inverted by an inverter into the signal $c$ (See FIG. 3, $c$), and the inverted signal $c$ is differentiated into the signal $d$ (See FIG. 3, $d$), which is applied to the LOAD-1 terminal of the counter 3. The pulse width of the output signals $h$ and $i$ from the monostable multivibrator 5-3 is so selected as to detect whether only one key is depressed or two keys are sequentially depressed within this pulse width.

The output signal $e$ from the monostable multivibrator 5-2 is inverted into the signal $f$, which is applied to a NAND gate to which is applied the output signal $i$ from the monostable multivibrator 5-3. The output signal $k$ from the NAND gate is differentiated into the signal $m$, which is applied to the LOAD-2 terminal of the counter 4, and the counter 4 is actuated in response to the negative-going pulse $m'$. The inverted signal $f$ and the output signal $h$ are applied to another NAND gate, and the output signal $j$ from the NAND gate is differentiated as shown at $l$ in FIG. 3. The positive going spike signal $l'$ is applied as the clear signal to the counter 4. Therefore, the input to the counters 3 and 4 is different as will be described hereinafter depending upon whether only one key or two keys are depressed during the time when the monostable multivibrator 5-3 is in its quasi-stable state.

When a first key on the keyboard 1 is depressed, the multivibrator 5-3 generates the output pulse signals $h$ and $i$, each with a pulse width of a few seconds. Since no further output signal $a$ is generated, the counter 4 is cleared in response to the clear signal $l'$, and in response to the negative-going spike signal $d'$ the binary coded signal representative of the channel number entered by the first key is stored in the counter 3.

When a second key is also depressed during the time when the monostable multivibrator 5-3 is still in its quasi-stable state, in response to the signal $m'$ applied to the LOAD-2 terminal of the counter 4, the content in the counter 3 is transferred into the counter 4. And in response to the signal $d''$ applied to the LOAD-1 terminal of the counter 3, the binary coded signal representative of the number entered by the second key is stored in the counter 3.

Next the reason will be described why the channel selector in accordance with the present invention is so arranged as to detect whether only one key is depressed or two keys are successively depressed within a predetermined time (a few seconds in the instant embodiment) when the monostable multi-vibrator is still in its quasi-stable state.

According to the present invention, to select the channel 6, the key corresponding to "6" is depressed contrary to the conventional channel selection method for depressing first the key "0" and then the key "6." In like manner, to select the channel 12, the key "1" is first depressed and then the key "2" is depressed. In summary, to select the single digit channel numbers from 1 to 9, only one key is depressed, and to select the two-digit channel numbers 10 to 99, two keys are depressed successively. The outputs from the low-order digit counter 3 are applied to a first decoder 8-1 in a channel indicator 8 so that a single digit channel number indicator 8-2 may be energized.

The outputs from the counter 3 are also applied to an X-decoder 7-1 in the X-decoder-driver 7, and the outputs from the decoder 7-1 are applied to a X-driver 7-2. In like manner, the outputs Q2A through Q2D from the high-order digit counter 4 are applied not only to a second decoder 8-4 in the channel indicator 8 to energize a tens-digit indicator 8-3 but also to a Y-decoder 6-1 in the Y-decoder-driver 6. The outputs from the decoder 6-1 are applied to a Y-driver 6-2. The outputs from the X- and Y-drivers 7-2 and 6-2 are applied not only to the memory block 16 to be described in detail with reference to FIG. 4, but also to the band selector 9 to be described in detail with reference to FIG. 8.

Figure 6:
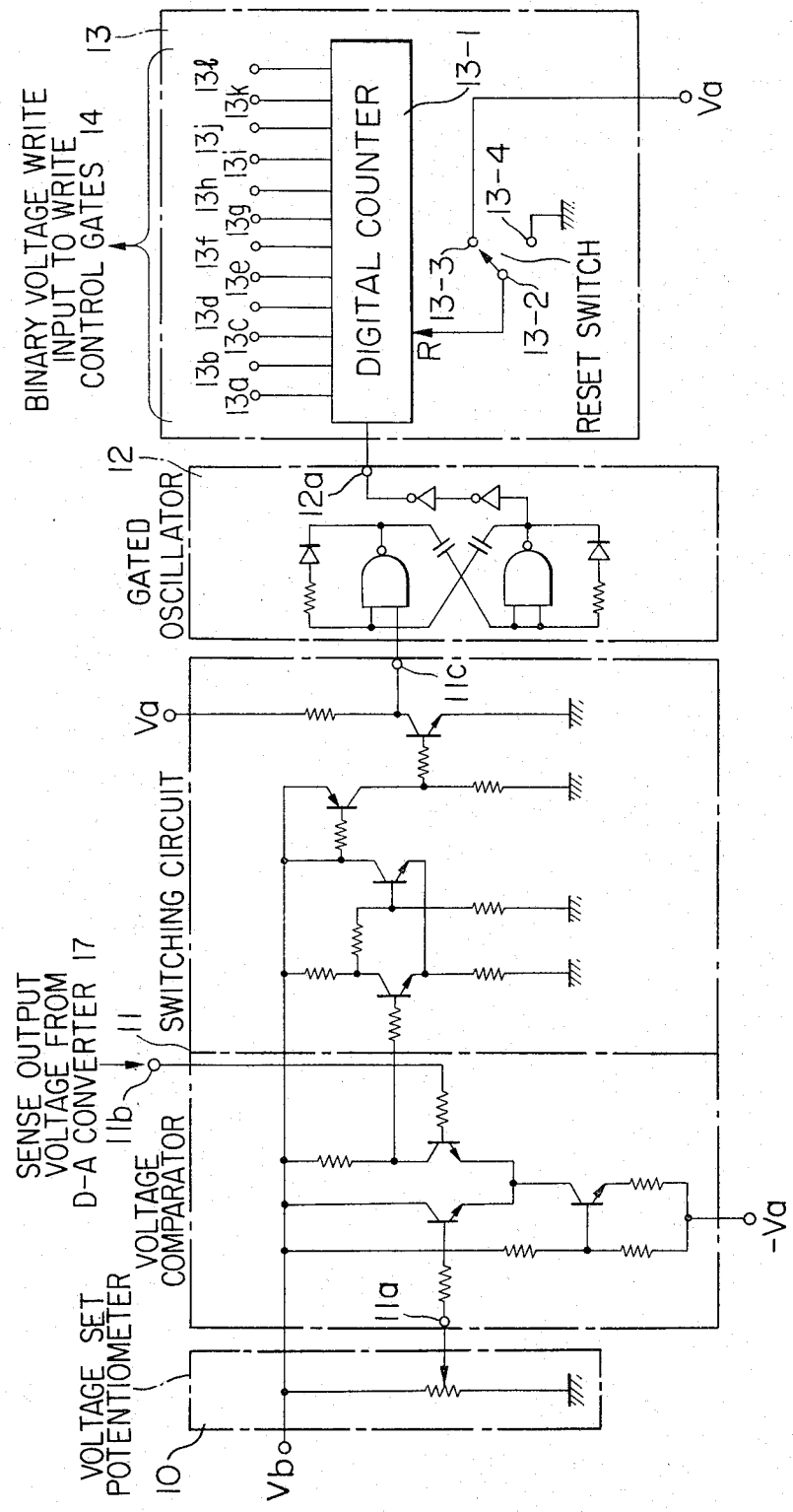
FIG. 6 is a detailed circuit diagram of write means.

Next referring to FIG. 6, the potentiometer 10, the voltage comparator 11, the gated oscillator 12 and the counter 13 will be described in detail hereinafter. The voltage comparator 11 includes a switching circuit such as a Schmitt circuit which generates a low-level signal or high-level signal depending upon whether the channel-selection voltage signal from the potentiometer 10 coincides with the voltage signal from the D-A converter 17. In response to the high-level output signal from the voltage comparator 11, the gated oscillator 12 is energized to drive the counter 13. The output from the counter 13 is applied through the write control gate 14 to the memory block 16.

Next referring to FIGS. 4A and 4B, the memory block 16 will be described in detail hereinafter. The outputs from the X-driver 7-2 are applied to the X-address signal terminals 7a through 7j, and the outputs from the Y-driver 6-2 are applied to the Y-address signal terminals 6a through 6g. In writing and reading operations, the X- and Y-address signals; that is, the output signals from the X- and Y-drivers 7-2 and 6-2 are raised selectively to a high level. For instance, in response to the high-level X- and Y-address signals applied to the terminals 7a and 6a, respectively, out of 70 memory elements in each of the 12 memory unit blocks 16-1 through 16-12, is selected the memory element 16a which, as shown in FIG. 4B, may be a R-S flip-flop or core memory. In writing, the write control switch 15 is switched to the write mode; that is, the movable contact 15-a of the control switch 15 is made into contact with the stationary contact 15-c which, in turn, is connected to a D.C. power source (not shown) so that the high-level signal may be applied to write control gate 14.

Next referring to FIG. 5, the write control gate will be described in detail hereinafter. When the high-level signal is applied to the input terminal 15-a; that is, the movable arm of the control switch 15, the input signals applied to the input terminals 13a through 13l are derived from the output terminals $14a_1$ through $14l_2$. However, when the low-level signal is applied to the input terminal 15a, high-level output signals are derived regardless of the inputs applied to the input terminals 13a through 13l. When an address is specified, the low-level output signals from the output terminals $14a_1$ through $14l_2$ become the set and reset signals to the memory elements. That is, the set signals are derived from the output terminals $14a_1$ through $14l_1$, and the reset signals, from the output terminals $14a_1$ through $14l_2$.

As is clear from the above explanation, the digitized channel selection voltage signals applied to the input terminals 13a through 13l may be stored in the memory block 16. Writing is accomplished when the movable arm 15-a of the control switch 15 is switched to the stationary contact 15-b (See FIG. 4A). In like manner, the 12-bit digital channel-selection voltage signals may be stored in other memory elements. The digital channel-selection voltage signal stored at each address is derived from the output terminals 17a through 17l (See FIG. 4A).

Figure 7:
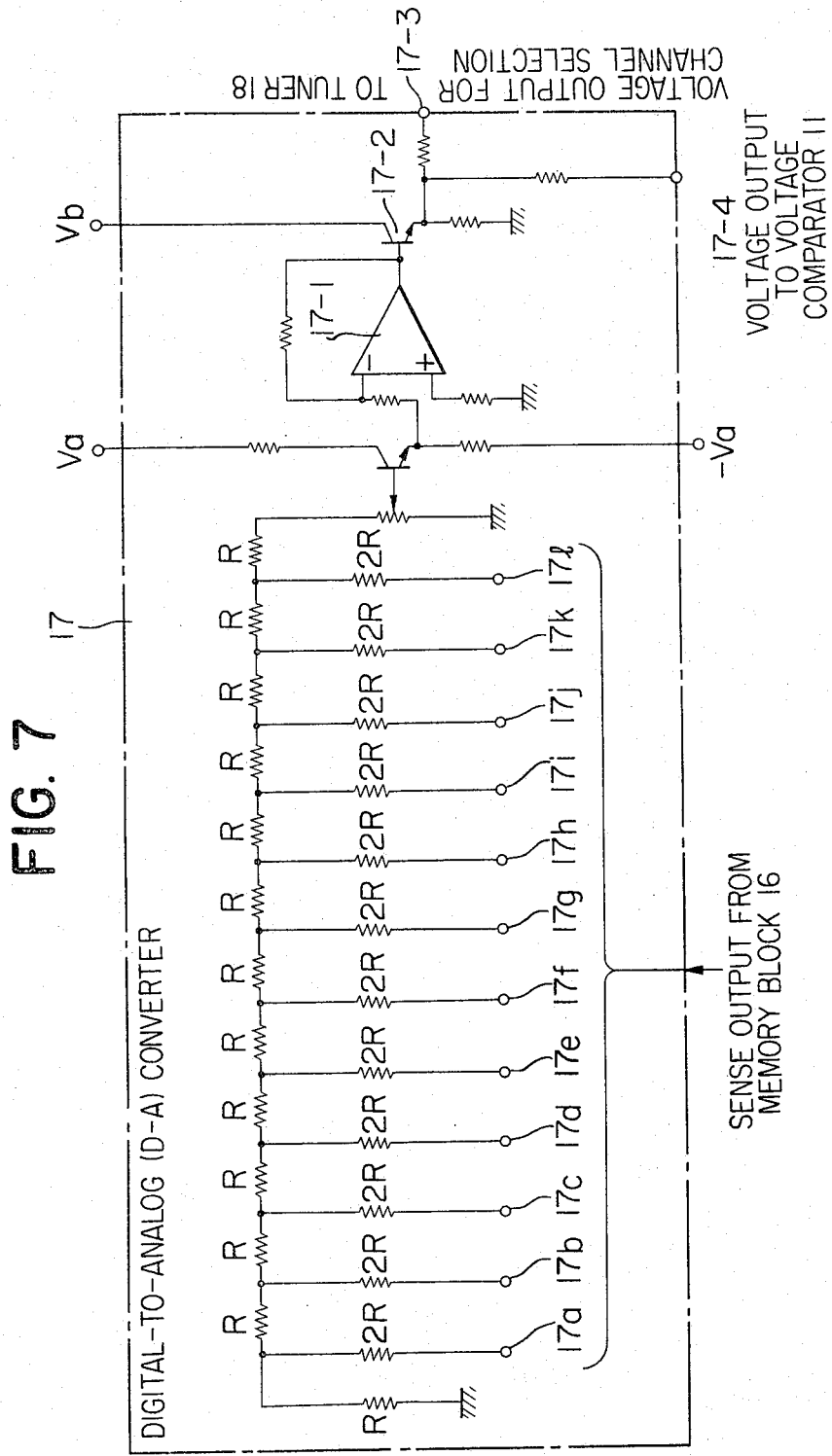
FIG. 7 is a detailed circuit diagram of a digital-to-analog converter.

The outputs from the memory block 16 are applied to the D-A converter 17 which is shown in detail in FIG. 7. The output from a ladder type network is derived through a D.C. amplifier 17-1 and an emitter-follower transistor 17-2 from an output terminal 17-4, and the output from the D-A converter 17 is applied to the voltage comparator 11 (See FIGS. 1 and 6).

When the channel-selection voltage signal coincides with the analog output signal from the D-A converter 17, the output signal derived from the output terminal 11c (See FIG. 6) of the voltage comparator 11 drops to a low level so that the gated oscillator 12 is de-energized, and the output from the counter 13 is stored in the memory block 16 in the manner described above. The output signal derived from the output terminal 17-3 (See FIG. 7) of the D-A converter 17 is applied to the voltage-variable reactance element in the tuner 18. The band selection in the tuner is controlled in response to the band selection signal from the band selector 9 shown in detail in FIG. 8.

Figure 8A:
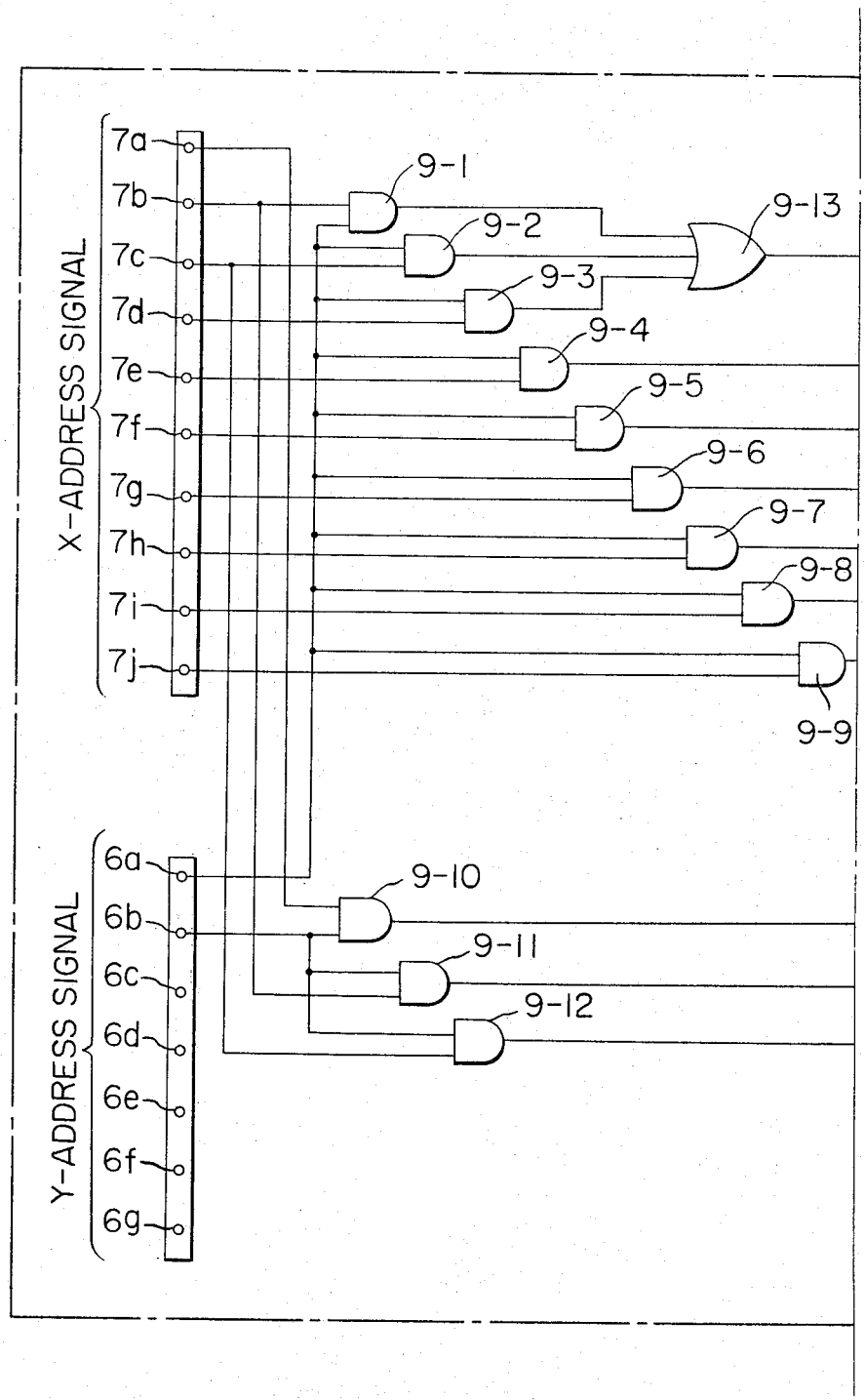

Referring to FIG. 8, the input signals at the input terminals 7a through 7j represent 0 through 9, respectively, and the input signals at the input terminals 6a through 6g represent 0 through 6, respectively. One of the output signals from AND gates 9-1 through 9-12 rises to a high level when one of the channels 1 through 12, respectively, is selected, and remain at a low level when any other channels are selected. The output signal from an OR gate 9-13 rises to a high level when one of the low VHF channels 1, 2 and 3 is selected, and the output signal from an OR gate 9-14 rises to a high level when one of the high VHF channels 4 through 12 is selected. The output signal from an OR gate 9-15 rises to a high level when the UHF channel is selected; that is, when the channels except the VHF channels 1 through 12 is selected, but remains at a low level when one of the VHF channels 1 through 12 is selected.

The levels of the output signals from the OR gates 9-13, 9-14 and 9-15 are changed by transistors 9-16, 9-22 and 9-20, respectively, and applied to switching elements 9-17, 9-18, 9-19 and 9-21. In response to the output signals derived from the output terminals 9a, 9b and 9c, the receiving channel bands of the tuner 18 are suitably switched. For instance, when the channel 1 is selected, the output signal at the terminal 9a has the same level with that of the power supply V$d$; and the output signals at the terminals 9b and 9c are at a low level. When one of the high VHF channels is selected, the output signal at the terminal 9b has the same level with that of the power source V$d$, the signals at the terminals 9a and 9c are at a low level. When one of the UHF channels is selected, the output signals at the terminals 9a and 9b are at a low level; and the output signal at the terminal 9c is at the same level with that of the power supply V$d$.

As described hereinbefore, according to the present invention, the desired channel entered by depressing the corresponding key or keys on the keyboard, the digital channel-selection signal representative of the desired channel number is read out of the memory block to select the desired channel. The channel selector in accordance with the present invention excludes any mechanical parts, and permits the instantaneous channel selection. Moreover the channel-selection signals stored in the memory block may be digitized depending upon the frequency-voltage characteristic curve of the tuner so that the channel-selection voltage signals may be stored with a higher degree of accuracy. When non-volatile storage elements are used, the permanent storage may be feasible. Since the channel selector in accordance with the present invention consists of the digital circuits a described above, the production of the channel selectors in the form of IC or LSI may be much facilitated. Furthermore, the digital display of the selected channel is also feasible.

What is claimed is:
1. A channel selector comprising
  a. an electronic tuner in which a voltage-variable reactance element is used as a tuning element;
  b. a memory block wherein channel selection voltages to be applied to said voltage-reactance element of said tuner are stored as digital signals, each of said voltages being of a value to tune said tuner to a desired channel;
  c. means for reading out one of said digitized channel-selection voltages from said memory block; and
  d. digital-to-analog converter means for converting the digitized channel-selection voltage read out from said memory block into the analog channel-selection voltage signal to be applied to said voltage-variable reactance element in said electronic tuner.

2. A channel selector as set forth in claim 1 wherein said memory block is of the X-Y matrix type; and said reading means includes
  X-address access means for making access to the X-address representing the unit digit of the desired channel to be selected, and
  Y-address access means for making access to the Y-address representing the tens digit of the desired channel to be selected.

3. A channel selector as set forth in claim 2 further comprising
  a. a keyboard for entering a desired channel number;
  b. unit-digit storage means for storing therein the digit of units of the desired channel number and transferring it into sid X-address access means;
  c. tens-digit storage means for storing therein the digit of tens of the desired channel number and transferring it into said Y-address access means;
  d. means for clearing the digit of units of the desired channel number in said unit-digit storage means and said tens-digit storage means in response to the first input signal from the keyboard representing the digit of units of the desired channel number; and
  e. means for transferring the content in said unit digit storage means into said tens-digit storage means in response to the second input signal from said keyboard which represents the digit of tens of the desired channel number and which is generated and applied to said unit-digit and tens-digit storage means within a predetermined time after said first input signal is generated.

4. A channel selector as set forth in claim 1 further comprising means for converting the analog channel-selection voltage signal into the digital channel-selection signal and storing said digital channel-selection signal in a location in said memory block.

5. A channel selector as set forth in claim 4 wherein said converting means comprises
  means for generating a channel-selection voltage signal with a predetermined level;
  comparator means for comparing the voltage signal from said channel-selection voltage signal generating means with the output voltage from said digital-to-analog converter means,
  oscillator means which is energized in response to the output signal from said comparator means for a time when said two voltage signals are not in coincidence with each other,
  counter means for counting the output signals from said oscillator means, and
  write control gate means for permitting the output signal from said counter means to be transferred into said memory block only when said output signal is to be stored in said memory block.

* * * * *